United States Patent [19]
Devlin et al.

[11] Patent Number: 5,254,374
[45] Date of Patent: Oct. 19, 1993

[54] CHEMICAL VAPOR INFILTRATION USING MICROWAVE ENERGY

[75] Inventors: David J. Devlin; Robert P. Currier; Joseph R. Laia, Jr., all of Los Alamos; Robert S. Barbero, Santa Cruz, all of N. Mex.

[73] Assignee: The United States of America as represented by the United States Department of Energy, Washington, D.C.

[21] Appl. No.: 866,025

[22] Filed: Apr. 8, 1992

[51] Int. Cl.$^5$ ............................................. B05D 3/02
[52] U.S. Cl. ................................... 427/553; 427/235; 427/237; 427/238; 427/255.2; 427/314; 427/398.1; 427/585
[58] Field of Search ............... 427/553, 235, 237, 238, 427/255.2, 314, 398.1, 585

[56] References Cited

U.S. PATENT DOCUMENTS

| | | | |
|---|---|---|---|
| 4,576,836 | 3/1986 | Colmet et al. | 427/255 |
| 4,580,524 | 4/1986 | Lackey, Jr. et al. | 118/725 |
| 4,823,734 | 4/1989 | Christin | 118/719 |
| 4,895,108 | 1/1990 | Caputo et al. | 118/728 |
| 4,980,202 | 12/1990 | Brennan et al. | 427/249 |
| 5,001,001 | 3/1991 | Ritter | 428/218 |

OTHER PUBLICATIONS

Deepak Gupta et al., "A Mathematical Model For Chemical Vapor Infiltration With Microwave Heating And External Cooling," J. Mater. Res., vol. 6, No. 4, pp. 810-818 (Apr. 1991).

Facsimile Transmission dated May 29, 1992 from Rich Silberglitt of Technology Assessment and Transfer, Inc. to Joel Katz of Los Alamos National Laboratory.

David P. Stinton et al., "Synthesis of Fiber-Reinforced SiC Composites By Chemical Vapor Infiltration," Ceramic Bulletin, vol. 65, No. 2, pp. 347-350, (1986).

Jose I. Morell et al., "A Mathematical Model For Chemical Vapor Infiltration With Volume Heating," J. Electrochem. Soc., vol. 139, No. 1, pp. 328-336 (Jan. 1992).

K. Sugiyama et al., "Pulse Chemical Vapour Infiltration of SiC In Porous Carbon Or SiC Particulate Preform Using an R.R. Heating System," J. of Materials Science, vol. 25, No. 10, pp. 4511-4517 (1990).

Primary Examiner—Bernard Pianalto
Attorney, Agent, or Firm—Richard J. Cordovano; Paul D. Gaetjens; William R. Moser

[57] ABSTRACT

A method for producing reinforced ceramic composite articles by means of chemical vapor infiltration and deposition in which an inverted temperature gradient is utilized. Microwave energy is the source of heat for the process.

10 Claims, 3 Drawing Sheets

CHEMICAL VAPOR INFILTRATION USING MICROWAVE ENERGY

BACKGROUND OF THE INVENTION

This invention relates to materials science and, more particularly, to chemical vapor deposition (CVD) and chemical infiltration (CVI). This invention is the result of a contract with the Department of Energy (Contract No. W-7405-ENG-36).

This invention is a method for making compositions by means of CVI and an inverted temperature gradient, where microwave energy is the source of heat for the process. Currently used commercial CVI processes involve conventional heating of a substrate, or preform, in an atmosphere containing gases which react to form a solid ceramic material. The reactant gases must be transported into pores, or open spaces, within a substrate and gaseous products of the reaction must be transported outward from the interior of the preform. In conventional heating processes, the exterior surfaces of a substrate are necessarily at the same temperatures or at higher temperatures than locations within the substrate. Thus, reaction of gases to produce the solid ceramic material tends to take place in pores near the surface of the substrate and thereby close off passageways for gas to diffuse into locations near the center of the substrate. Weeks and months are usually required to produce an article of any size and often the degree of densification of the article is unsatisfactory. Also, it is often necessary to interrupt a CVI process to subject an article to diamond machining to reopen passageways into the center region of the article in order that deposition in and densification of the center region may continue. A method for CVI which is currently being developed at Oak Ridge National Laboratory is referred to as the thermal gradient forced flow method, where one end of an article is heated and reactant gases are forced through the article from its cold end. This method reduces processing time to days but is restricted to simple shapes.

SUMMARY OF THE INVENTION

This invention is a method for producing reinforced ceramic composite articles by means of chemical vapor infiltration and deposition in which an inverted temperature gradient is utilized. Microwave energy is the source of heat for the method.

It is an object of this invention to provide a process for CVI which will produce articles in shorter periods of time than is now possible.

Also, it is an object of this invention to eliminate interruption of CVI in order to machine semi-finished articles to reopen flow passageways.

It is another object to provide reinforced ceramic articles having less porosity and a more uniform density than has been possible with previous CVI processes.

It is a further object of this invention to permit production of articles having complex shapes.

In one embodiment, the invention may be characterized as a method a method for producing a composite consisting essentially of one or more ceramic materials and one or more reinforcing materials, said method comprising providing a porous preform in a gas-tight chamber; heating said preform by means of microwave energy in order to establish temperature gradients within the preform such that temperatures of locations within the preform increase as distances of said locations from exterior surfaces of the preform increase, where portions of said preform are at or above a minimum reaction temperature; providing reactants in gaseous form to said chamber, where said reactants are capable of reacting to form a ceramic material when raised to a temperature at or above said minimum reaction temperature; transporting said reactants to preform locations which are at or above said minimum temperature and depositing said ceramic material at said locations, thereby densifying said preform to form said composite; continuing to heat locations in said preform to temperatures at or above said minimum temperature and continuing to transport reactants as specified in step d such that densification continues in a progressive manner, with locations at the interior of the preform becoming densified prior to locations adjacent to exterior surfaces; removing gas consisting of unreacted reactants and reaction products from said chamber; and cooling the densified preform.

DETAILED DESCRIPTION OF THE INVENTION

Figure 1:
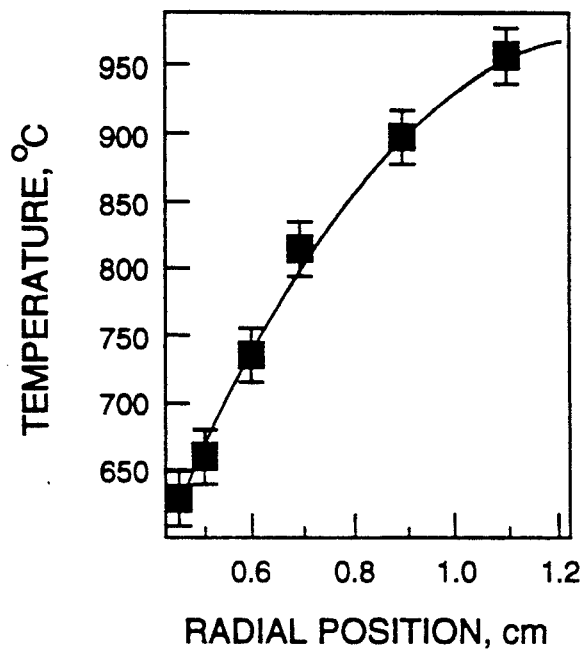
FIGS. 1 and 2 are plots showing temperature gradients, where temperatures were measured at points within a preform which was heated in the apparatus depicted in FIG. 4. The curves are reproductions of plots produced by use of a curve-fitting computer program.

In practice of the invention, microwave energy is used in CVD processes to produce inverted thermal gradients within a porous preform or porous substrate; maximum temperatures are produced within the substrate and temperatures decrease as distance from the center region of the substrate increases. Temperatures at locations near the outer surfaces of the substrate are maintained at values less than the minimum temperature required for reactant gases to react to form a solid ceramic material; thus, deposition of the ceramic first takes place in center locations of the substrate and does not initially take place in outer locations, which clogs gas passageways into the center. As deposition proceeds, temperatures are progressively increased to cause deposition to take place in a progressive manner, with locations at the interior of the preform becoming densified prior to locations adjacent to exterior surfaces.

Consider the following theoretical example. A sphere of a material which uniformly couples to microwaves and is uniform in composition and porosity is placed into a multimode microwave cavity where the microwave energy is homogeneously distributed throughout at least the volume of the cavity occupied by the sphere. The sphere will heat uniformly. However, a temperature gradient will form within the sphere, with the highest temperature at the center of the sphere and the lowest temperatures at the exterior surface of the sphere. That the gradient forms is due to heat loss from the exterior surface by mechanisms such as convection and radiation and, if heat loss from the surface is uniform, the surface temperature will be uniform and a single uniform gradient will exist within the sphere. Assume that the microwave power level is adjusted to heat the center to 1000° C. and that the surface temperature stabilizes at 500° C. Adding reactant gases which react to form a solid to the cavity and allowing time for the gases to diffuse to the center of the substrate results in formation of a composite consisting of a deposited material and the substrate material at the center region of the substrate sphere. For example, methyltrichlorosilane (MTS) vapor and hydrogen will react to form silicon carbide (SiC). Passageways to the center region from the exterior do not fill with deposited material because only the center region of the substrate is at a high enough temperature for the reaction to take place. Gas formed as the product of the reaction which produces the solid material diffuses out from the center region. In the above mentioned SiC producing reaction, HCl is a product gas. As densification proceeds and a sphere of composite having its center at the center of the substrate sphere is formed, the temperature gradient changes such that temperatures of locations further from the center rise to values at which solid deposits form and the composite sphere grows in diameter. This change in gradient may be explained as follows. If the deposited material couples well and uniformly to the electromagnetic radiation, the deposits will heat, thus raising the temperature of the center region of the substrate and thereby increasing temperatures in the rest of the substrate. If the deposited material does not couple well with the microwave radiation, the amount of heat added may diminish as the thickness of the deposited coating on the substrate increases beyond the depth of penetration of the microwave radiation (skin depth). In this case, it may be necessary to increase the power level or take other measures, as described below.

A porous substrate may be any useful reinforcing material having accessible porosity, that is, which is sufficiently porous that reactant gases and gaseous reaction products will migrate to and from the interior of the substrate and which will not be degraded by exposure to the temperatures required for deposition to take place or by exposure to the reactant gases and product gases. The word porous is used to refer to any material that contains open space or passageways of any kind, including bundles or aggregations of fibers and woven materials. Examples of materials which may be used include metal oxides, metal nitrides, carbides such as SiC, borides such as $TiB_2$, silicides such as $MoSi_2$, alumina, and silicon nitride. The substrate may be a powder which has been consolidated by sintering or pressing or may be an open-cell foam of a material such as carbon or a ceramic. Such a foam may be produced by use of CVD to coat a polyurethane foam and then burning out the polyurethane. Fibers which are woven or chopped may be used; chopped fibers would be pressed into a coherent shape or retained within a porous container. Examples of fibers which may be used include those of sapphire, silicon nitride, boron, SiC, and those comprised of alumina.

The deposited ceramic may be any solid which may be formed from gaseous reactants. MTS ($CH_3SiCl_3$) and hydrogen are commonly used in CVI. Other examples follow. $Si_3N_4$ may be deposited using $SiCl_4$ and $NH_3$, alumina may be deposited using $AlCl_3$ and $CO_2$, and $ZrO_2$ may be deposited using $ZrCl_4$ and $CO_2$. Hydrogen gas is frequently an additional reactant in systems such as that which deposits $ZrO_2$ and it is often used as a carrier for reactants which are liquid at room temperature. A paper entitled "Advanced Ceramics by Chemical Deposition Techniques" by Stinton, Besmann, and Lowden, Ceramic Bulletin, Vol. 67, no. 2, (1988) contains a list of ceramic materials which may be produced by CVD (materials other than those listed may also be used in practice of the invention).

Experimentation was conducted to determine whether inverted thermal gradients satisfactory for use in CVI from the "inside out" could be produced. A substrate, or preform, of Nicalon ® SiC cloth was made. The present inventors discovered that this material could be heated by microwave radiation. The preform consisted of 20 circular pieces of cloth stacked on top of one another to form a cylinder having a diameter of about 7 cm and a length (or height) of about 2 cm. It was placed on a quartz table in a multimode General Electric household type microwave oven having a power rating of 700 W which produces microwave energy at a frequency of 2.45 GHz. Quartz fiber optic cables were placed at locations within the preform to measure the temperatures at the locations. The cables were run through a small hole drilled through the oven and connected to photodiodes which provided voltages proportional to temperature. The photodiodes were connected to amplification and read-out devices. Each of these optical thermometers was previously calibrated by placing it in an SiC cloth stack of the same dimensions with a thermocouple next to the fiber optic and heating in a conventional oven.

Figure 2:
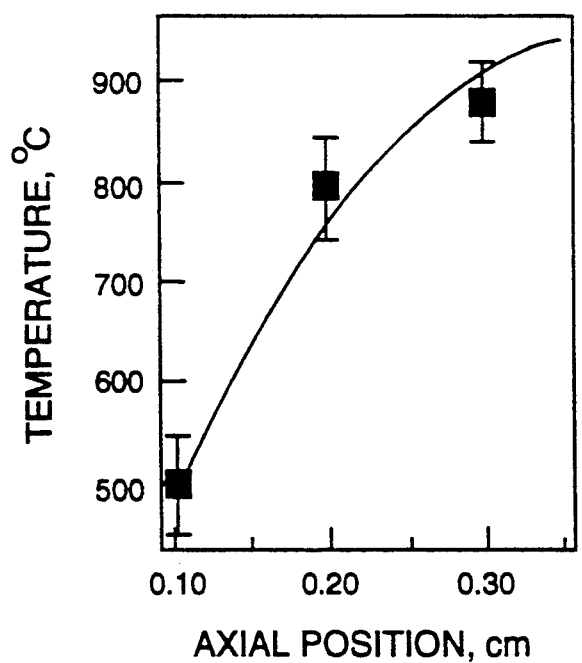
Figure 3:
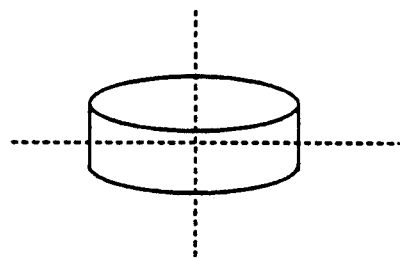
FIG. 3 depicts a cylindrical preform used in proof of principle experimentation with dotted lines showing where temperature measurements were taken.

Temperature readings taken after power was applied for a sufficient time period for the readings to stabilize are shown in FIGS. 1 and 2. The error bars above and below each data point represent estimated uncertainties in positioning of the fiber optic cables in the preform and expected variations in voltage deduced from the calibration procedure. Calibration in the conventional oven and temperature profiling in the microwave oven were done in air at atmospheric pressure. FIG. 1 is a plot of temperature vs. radial position, where the temperatures were determined at points along a diameter of the cylinder which passes through the center of the longitudinal axis of the cylinder. FIG. 3 depicts the cylinder with dotted lines indicating the center diameter and the longitudinal axis. Radial position is measured starting at the outer surface of the cylinder. FIG. 2 is a plot of temperature vs. axial position, where axial position is measured along the longitudinal axis starting at the top end surface of the cylinder (the bottom end surface is resting on the quartz table). The measurement points were located only short distances from the outer edges of the cylinder because the quartz fiber optics would have been damaged by temperatures above about 1000° C. which occurred in the center region of the substrate. It can be seen from FIGS. 1 and 2 that a temperature gradient suitable for practice of the invention was produced. The temperature in the center region of the cylindrical preform, though not measured, was undoubtedly sufficiently high that the reaction of, for example, MTS and $H_2$ to produce SiC would have taken place. If different power levels had been available with the oven used, the temperature curve could have been shifted upward or downward on the plot by varying power.

Figure 4:
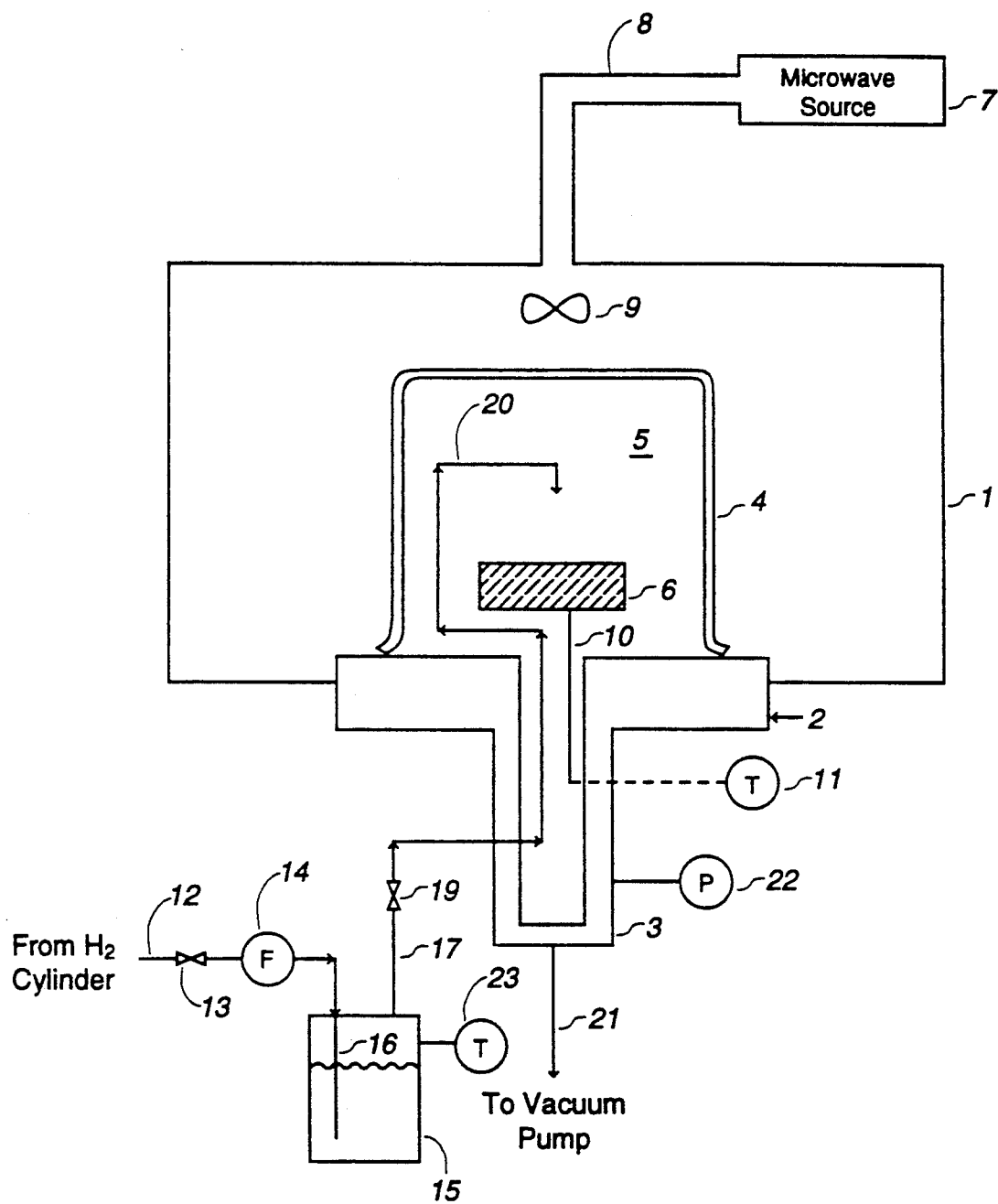
FIG. 4 is a schematic diagram of apparatus used in proof of principle experimentation which depicts a microwave oven having within it a bell jar for containing reactant gases and a preform upon which a solid is deposited by means of a reaction involving the gases.

In further proof of principal experimentation, SiC was deposited in preforms of SiC yarn of the type and dimensions described above. FIG. 4 depicts the apparatus which was used. A commercial GE oven as described above was modified by cutting a circular hole in the floor of the microwave cavity 1. The removed floor portion was replaced by plate assembly 2, which includes a hollow cylindrical tube 3 at its center. Pyrex ® bell jar 4 is inverted and rests on plate assembly 2. Sealing means (not shown) are provided between jar 4 and plate assembly 2 so that the interior of the jar is a sealed chamber, as depicted by reference number 5. The interior of tube 3 is open to chamber 5. Preform 6 is placed on a quartz ring (not shown) which is resting on plate assembly 2. Electromagnetic radiation produced by microwave source 7 is conducted to cavity 1 by wave guide 8 and mode stirrer 9 aids distribution of the microwaves throughout the cavity. Thermocouple 10 is positioned to measure the temperature of preform 6 and provide a signal to temperature indicator 11. Conduit 12 is connected to a cylinder containing hydrogen (not shown) and provides hydrogen gas to reservoir 15 by means of tube 16, which projects underneath the level of liquid MTS in the reservoir. The flow of hydrogen is measured by mass flow meter 14, which is of the thermal conductivity type, and may be varied by use of valve 13 in conduit 12. A mixture of hydrogen and MTS vapor flows out of reservoir 15 via conduit 17, passing through valve 19 which may be used to regulate the flow. Temperature of the space above the liquid level in reservoir 15 is determined by temperature measuring device 23 and temperature adjustment means (not shown) are used to heat or cool the liquid in the reservoir using a circulating water stream. Conduit 19 provides the reactant gas mixture to distribution tube 20, which discharges the mixture above preform 6. Gas is removed from chamber 5 by means of conduit 21, which is connected to a vacuum pump. Pressure measuring device 22 is used to determine pressure in chamber 5. Apparatus (not shown) to purge the oven with argon was used. The apparatus has ports (not shown) for removing samples.

Experiments were conducted under two sets of experimental conditions, as shown in the Table.

TABLE

| Case | Chamber Pressure | $H_2$ Flow Rate | MTS Partial Pressure | Approx. SiC Deposition Rate |
| --- | --- | --- | --- | --- |
| I | 300 Torr | 4000 sccm | 1 Torr | 0.5 mg/min |
| II | 600 Torr | 500 sccm | 20 Torr | 7.0 mg/min |

Figure 5:
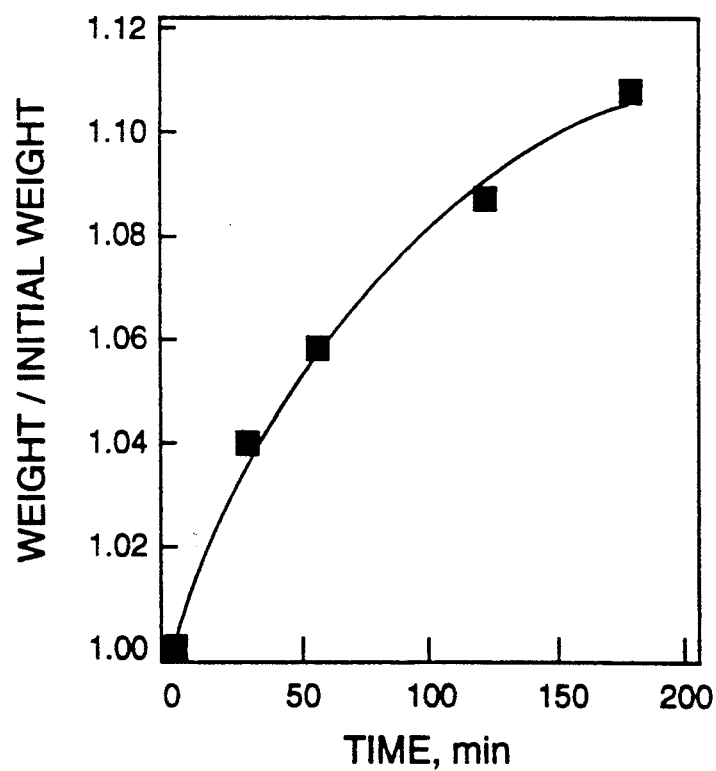
FIG. 5 is a plot which shows weight gained by a SiC yarn substrate after deposition was conducted on it for various time periods. This curve is a reproduction of a plot produced by use of a curve-fitting computer program.

Partial pressures of MTS were determined by sampling the gases inside the apparatus and analyzing the samples by infrared spectroscopy. Approximate deposition rates of SiC were determined by noting the increase in weight of the preform and the time period for which deposition took place. The reaction of MTS and $H_2$ takes place above about 900° C. and the deposition range is often stated to between 900° and about 1400° C. FIG. 5 shows weight gain of a substrate vs. time in an experiment done using the conditions of Case II. The data points were determined by periodically interrupting deposition to remove the preform from the microwave oven for weighing. Reheating to deposition temperatures after return of the preform to the oven took place very quickly and no adjustments were made to deposition time for this reason.

After a short period of SiC deposition using the Case I conditions, the stack of yarn pieces was disassembled. On a piece located in the center of the stack, a roughly circular area where SiC was preferentially deposited on the fibers was observed. The area of deposition was about 1.75 cm in diameter and offset somewhat from the center of the circle of yarn. Areas of deposition were also noted on other yarn pieces which were progressively smaller in diameter as the distance of the piece from the center of the stack increased.

In deposition of longer duration, upon starting heating of a preform and deposition under Case I conditions, a first luminous region at the center of the preform was observed. After about 15 minutes, the region became dull except for a small area around the periphery of the region. The 15 minute period was sufficient to apply a coating about one micron thick to the fibers. Then, a second region of luminosity surrounding the first region grew rapidly while the dull region remained. After another 15 minutes (30 minutes total), the second region of luminosity dulled and a third region of luminosity appeared. This behavior was repeated with several areas of luminosity being sequentially observed which were not centered on the center of the preform. After about one hour, no luminosity was observed and deposition ceased. The area of deposition extended nearly to the outer edge of the center layer of cloth at several points and there were several areas of little deposition within the large area of deposition. It is believed that upon reaching a critical coating thickness (of about one micron in this set of conditions), a new set of modes was established and a new heating pattern occurred because the coating was pure beta SiC, which is a semiconductor at high temperatures and therefore does not couple well with microwaves. When the skin penetration depth is exceeded, heating rate decreases. The Nicalon ® cloth is micro-crystalline SiC containing impurities such as oxygen and carbon and it is believed that its conductivity does not change significantly with temperature. Another causative factor of this behavior is the inhomogenous heating pattern in this type of microwave oven; this is known to every household user of a microwave oven by means of widely varying temperatures of food heated in the oven. It is believed that a higher power oven and/or an oven having larger cavity dimensions (leading to more homogenous microwave distribution) would eliminate this observed behavior.

After a preform was heated and SiC was deposited using Case II conditions, inspection of the center layer of cloth showed deposition on a circular center area with some variation in density within the densified area. It did not appear that cooling of interior regions occurred as deposition proceeded. It is believed that the inhomogenous microwave pattern was responsible, at least in part, for the varying deposition rate over the piece of cloth. Micrographs were made, each of a single strand of yarn, that is, of the bundle of fibers which make up the strand. The micrographs were end views of strands which were cut. It was shown by the micrographs that near full densification of several of the strands had taken place. This indicates that additional deposition would have filled in the spaces between strands.

The experimentation is discussed in a paper presented at a Materials Research Society meeting in Boston in December 1991 which is to be published in a meeting proceedings volume. The paper is entitled "Microwave Assisted Chemical Vapor Infiltration" and the authors are Devlin, Currier, and others. This paper is hereby incorporated in full into this patent application. Based on the Case I results reported in this paper, it is possible that further research will reveal that deposition can be irregular when the substrate and the deposited ceramic have similar microwave-coupling properties or the deposits reflect microwave energy. It is believed that under Case II conditions and a deposition temperature of about 1000° C., there may occur preferential deposition of Si over SiC. If these phenomena do occur, there are techniques which may be used to surmount this problem, such as are mentioned below.

It is not necessary to the practice of the invention that a substrate material and a deposited ceramic material couple to microwaves, as there exist techniques by which the necessary heat input can be provided by microwave energy to form an inverted gradient in the absence of microwave susceptibility or when there is some susceptibility but a material is not substantially heated by microwaves. The deposited ceramic need not couple to microwaves if the substrate does so. A substrate material that is transparent to microwaves or does not heat well by means of microwave energy may be coated with a thin layer of a material which does couple and heat well. This thin layer, which could be deposited by, for example, slurry infiltration or conventional CVI, would provide initial heating which would be supplemented by microwave heating of the deposits as deposition progresses. Only a portion of a substrate may be coated, as uncoated non-suscepting substrate material may be sufficiently heated by suscepting deposits after a sufficient volume of deposits has accumulated. It may also be desirable to provide a thin coating of a material on a substrate for reasons unrelated to microwave heating, such as to alter or adjust the mechanical properties of the composite article. This coating may or may not couple to microwave energy and may be deposited by practice of the invention. Examples of such coating materials are carbon and boron nitride. When the geometry of a substrate is appropriate, initial heating of a substrate may be accomplished by placing removable microwave susceptors adjacent to the substrate or by use of resistance heating elements. An application of this is where a material must be heated to a particular threshold temperature in order to suscept microwaves.

It is expected that pressure pulsing operation-varying the pressure in the deposition chamber-will enhance transport of reactant gases into the interior spaces of a substrate, thereby improving, in certain cases, both rate and quality of densification. Pressure pulsing provides transport mechanisms in addition to diffusion. The pressure may oscillate in some manner with time, such as in a sine wave, where the amplitude of an oscillatory component of the total pressure may be greater than the magnitude of the steady state component of the pressure or the steady state component may be larger than the oscillatory component. In another mode of pressure pulsing, the flow of gases into the chamber will be stopped while the chamber is evacuated, then gas flow into the chamber will be restarted, and then these steps are repeated.

It is expected that power pulsing operation will be useful; power levels may be varied in order to vary the temperature of the article or power may be periodically turned off. For example, pulsing power may be useful in the final stages of densification. As an article approaches maximum densification, deposit rate may become limited by the rate of transport of gas through small passageways. Periodically stopping heating will permit gases to migrate into open spaces without reaction occurring and deposition will take place in those spaces when energy is again applied to the article.

The frequency of electromagnetic radiation which may be used in the practice of the invention will range from about 0.3 to about 300 GHz. Though it is expected that multimode microwave chambers will be used in most applications, single mode cavities may also be utilized in practice of the invention and may offer unique advantages in certain applications. A multimode cavity is relatively inexpensive and easy to operate. Single mode cavities typically involve regions of high field concentration, standing wave patterns, and localized hot-spots. They require internal tuning capabilities by which cavity dimensions and the depth of the coupling probe may be varied until a resonant field is found. Tuning action is necessary to compensate for disturbances in the electromagnetic field by the article, due to its dielectric properties. The single mode cavity is more energy efficient than its multimode analogue and can localize heating. For example, in the $TM_{012}$ mode the electric field is directed along the major axis of a cylindrical cavity, with a concentration at the axis. However, the use of a single mode cavity during the densification of articles of complex shapes may require nontrivial tuning schedules.

A substrate may be comprised of a mixture of several materials. For example, a woven substrate may contain fibers of several different materials. More than one ceramic material may be deposited in a single preform by changing the reactant gases used. A laminated or multilayered composite may be produced.

The present invention includes a mode of operation which may be termed plasma-enhanced CVI. During practice of the invention as described above, a glow discharge plasma may be created in the deposition chamber by reducing the pressure sufficiently, at a given power level, to ignite the plasma. This may enhance the kinetics of the deposition reactions. A plasma may be continuously maintained or created periodically during production of an article. Energy for creation of a plasma is supplied by the microwaves.

Vapor phase nucleation is known to occur in CVI processes, in which reactions take place completely in the vapor phase and not at a site on a substrate or previously deposited solid. Particles of solid material which do not adhere well are created, degrading the homogeneity of the finished article. This may be controlled by techniques such as limiting reactant concentration and temperature.

What is claimed is:

1. A method for producing a composite consisting essentially of one or more ceramic materials and one or more reinforcing materials, said method comprising:
   a. providing a porous preform;
   b. providing reactants in gaseous form to a gas-tight chamber where said preform is located, where said reactants are capable of reacting to form a ceramic material when raised to a temperature above a minimum reaction temperature;
   c. heating said preform by means of microwave energy in order to establish temperature gradients within the preform such that temperatures of locations within the preform increase as distances of said locations from exterior surfaces of the preform increase and continuing to heat until all of said preform has been heated to temperatures at or above said minimum reaction temperature; and d. removing gas consisting of unreacted reactants and reaction products from said chamber.

2. A method for producing a composite consisting essentially of one or more ceramic materials and one or more reinforcing materials, said method comprising:

a. providing a porous preform in a gas-tight chamber;

b. heating said preform by means of microwave energy in order to establish temperature gradients within the preform such that temperatures of locations within the preform increase as distances of said locations from exterior surfaces of the preform increase, where portions of said preform are at or above a minimum reaction temperature;

c. providing reactants in gaseous form to said chamber, where said reactants are capable of reacting to form a ceramic material when raised to a temperature at or above said minimum reaction temperature;

d. transporting said reactants to preform locations which are at or above said minimum temperature and depositing said ceramic material at said locations, thereby densifying said preform to form said composite;

e. continuing to heat locations in said preform to temperatures at or above said minimum temperature and continuing to transport reactants as specified in step d such that densification continues in a progressive manner, with locations at the interior of the preform becoming densified prior to locations adjacent to exterior surfaces;

f. removing gas consisting of unreacted reactants and reaction products from said chamber; and g. cooling the densified preform.

3. The method of claim 2 where said ceramic material is not capable of substantial heating by microwave radiation.

4. The method of claim 2 where said preform or a portion of said preform is coated with a substance which is heated by microwave energy.

5. The method of claim 2 where said preform is not capable of substantial heating by microwave energy, a portion of said preform is coated with a substance which is heated by microwave energy, and said ceramic material is capable of heating by microwave energy.

6. The method of claim 2 where said preform is coated with a substance for the purpose of altering the mechanical properties of said composite.

7. The method of claim 2 where said preform is initially heated by means other than microwave energy to a temperature at which said preform will couple to microwave energy.

8. The method of claim 2 where the pressure in said chamber is varied.

9. The method of claim 2 where the power level of said microwave energy is varied.

10. The method of claim 2 where a glow discharge plasma is created adjacent to said preform in said chamber.

* * * * *